United States Patent [19]
Yamada et al.

[11] Patent Number: 5,968,686
[45] Date of Patent: Oct. 19, 1999

[54] CHARGED-BEAM EXPOSURE MASK AND CHARGED-BEAM EXPOSURE METHOD

[75] Inventors: Yasuhisa Yamada; Hiroshi Nozue, both of Tokyo, Japan

[73] Assignee: NEC Corporation, Tokyo, Japan

[21] Appl. No.: 08/910,424

[22] Filed: Aug. 13, 1997

[30] Foreign Application Priority Data

Aug. 15, 1996 [JP] Japan .................................. 8-215626

[51] Int. Cl.⁶ ...................................................... G03F 9/00
[52] U.S. Cl. ............................................... 430/5; 430/296
[58] Field of Search ................... 430/5, 296; 250/492.1, 250/492.3

[56] References Cited

U.S. PATENT DOCUMENTS 5,334,282  8/1994  Nakayama et al. .......................... 430/5
5,674,413  10/1997  Pfeiffer et al. ...................... 219/121.25

FOREIGN PATENT DOCUMENTS 7142321  6/1995  Japan .
7201701  8/1995  Japan .

*Primary Examiner*—S. Rosasco
*Attorney, Agent, or Firm*—Sughrue, Mion, Zinn, Macpeak & Seas, PLLC

[57] ABSTRACT

An electron-beam exposure mask that is able to realize the required pattern transfer accuracy independent of the deflection distortion and aberration of an electron beam. This mask includes a substrate with a first area and a second area, a first plurality of cell apertures formed in the first area of the substrate, and a second plurality of cell apertures formed in the second area of the substrate. The first area of the substrate is designed so that a charged-beam irradiated to the first area has a deflection angle less than a reference angle. The second area of the substrate is designed so that a charged-beam irradiated to the second area has a deflection angle equal to or greater than the reference angle. Each of the first plurality of cell apertures corresponds to fine patterns necessitating high pattern transfer accuracy. Each of the second plurality of cell apertures corresponds to rough patterns unnecessitating the high pattern transfer accuracy.

14 Claims, 6 Drawing Sheets

CHARGED-BEAM EXPOSURE MASK AND CHARGED-BEAM EXPOSURE METHOD

BACKGROUND OF THE INVENTION

1. Field of the Invention

The present invention relates to charged-beam exposure such as electron- or ion-beam exposure used in semiconductor device fabrication and more particularly, to a charged-beam exposure mask having different cell apertures each of which typically corresponds to unit repetitive patterns of an integrated circuit (IC) chip, and a charged-beam exposure method using the exposure mask.

2. Description of the Prior Art

In recent years, the need for high throughput has been becoming stronger and stronger in semiconductor device fabrication processes with the progressing integration scale and increasing packing density in ICs. It is needless to say that this need is applied to lithography processes using an electron beam, i.e., electron beam lithography.

To cope with the need for higher throughput, an improved method termed the "cell projection method" has been developed in electron-beam lithography. With this "cell projection method", typically, an exposure mask has different cell apertures, each of which corresponds to unit repetitive patterns of an IC chip, in addition to a shaping aperture for forming a variable-shaping aperture. On use, an electron beam is repetitively irradiated to the individual cell apertures or the shaping aperture for each IC chip.

FIG. 1 shows an example of the conventional exposure masks designed for the cell projection method. In FIG. 1, a plurality of apertures 102a, 102b, and 102c are regularly formed in a substrate 101 of a conventional exposure mask 100.

The shaping aperture 102a, which is rectangular and serves to form a variable-shaped electron beam, is located in the central area of the substrate 101. The cell apertures 102b, each of which corresponds to unit repetitive patterns of an IC chip, are located in the peripheral area of the substrate 101. The cell apertures 102c, each of which corresponds to unit repetitive patterns of the same IC chip, are located in an intermediate area of the substrate 101. The geometry of these cell apertures 102b and 102c is determined according to the designed layout (or exposure) data of the IC chip.

The selection of the apertures 102a, 102b, and 102c is carried out by deflection of an electron beam. Specifically, as shown in FIG. 2, a rectangular-shaped electron beam 121 is irradiated toward the conventional exposure mask 100. The beam 121 has been shaped into a rectangle by a beam-shaping mask (not shown) located between an electron source and the mask 100.

The electron beam 121 is deflected by a beam deflector (not shown) located between the beam-shaping mask and the exposure mask 100 so as to be irradiated to one of the apertures 102a, 102b, and 102c, thereby selecting the aperture 102a, 102b, or 102c. The beam 121 having passed through the selected aperture 102a, 102b, or 102c is projected on an area of an electron-beam resist layer on a semiconductor wafer, thereby transferring the patterns corresponding to the apertures 102a, 102b, and 102c onto the resist layer.

The layout or arrangement of the apertures 102a, 102b, and 102c is optionally determined according to an intention of a mask designer.

With the conventional exposure mask 100 shown in FIG. 1, when the electron beam 121 is irradiated to the shaping aperture 102a located in the central area of the mask 100, no deflection is necessary for the beam 121, because the axis of the beam 121 is designed to be aligned with the center of the mask 100.

However, when the electron beam 121 is irradiated to any one of the cell apertures 102b and 102c located in the peripheral and intermediate areas of the mask 100, the beam 121 needs to be deflected by an angle θ with the use of the beam deflector. It is clear that the value of the angle θ for the cell apertures 102b in the peripheral area is greater than that for the cell apertures 102c in the intermediate area.

The deflection distortion and aberration of the beam 121 increases with the increasing amount of the beam deflection, i.e., the deflection angle θ. Therefore, obtainable pattern-placement accuracy on a semiconductor wafer will degrade proportional to the deflection angle θ. This means that some problems will occur due to the degradation in pattern-placement accuracy when one of the apertures 102b in the peripheral area of the mask 100 is selected.

To solve the above problems due to the degradation in pattern-placement accuracy, conventionally, various approaches have been made for the purpose of decreasing the deflection distortion and aberration of the electron beam 121.

For example, an improved electron beam exposure system is disclosed in the Japanese Non-Examined Patent Publication No. 7-201701 published in August 1995. With this system, a driving voltage applied across a pair of opposing electrodes forming a sub beam deflector is increased by a specific amount according to the deflection amount of an electron beam caused by a main deflector. At the same time, another driving voltage applied across another pair of opposing electrodes forming the sub beam deflector is decreased by the same specific amount. Thus, the aberration of the electron beam is compensated.

Further, an improved deflection compensation method of an electron-beam exposure system is disclosed in the Japanese Non-Examined Patent Publication No. 7-142321 published in June 1995. In this method, the deflection amount of an electron beam is measured when a mark formed at a specific location on a semiconductor wafer is detected in a first step. Next, the measured deflection amount is set as compensation data for the electron beam in a second step. A time period until the measured deflection amount will reach the maximum tolerance limit is predicted based on the changing rate of the measured deflection amount in a third step. The first, second, and third steps are directed to be performed for a next measurement at the time when the predicted time period will be passed in a fourth step.

With the conventional techniques disclosed in the Japanese Non-Examined Patent Publication Nos. 7-201701 and 7-142321, however, there are the following problems.

Because these conventional techniques necessitate the structural change of the electron-optical system for deflecting an electron beam, the resultant electron exposure system will have a complicated structure. Also, they are unable to completely eliminate the above-described problems due to the degradation in pattern placement accuracy.

Especially, in recent years, miniaturization of the semiconductor devices or ICs has been progressing more and more and therefore, the required pattern-placement accuracy in electron beam lithography has been becoming severer and severer. From this point of view, it is difficult for the conventional techniques disclosed in the Japanese Non-Examined Patent Publication Nos. 7-201701 and 7-142321 to realize the satisfactory pattern-placement accuracy.

SUMMARY OF THE INVENTION

Accordingly, an object of the present invention is to provide a charged-beam exposure mask and a charged-beam exposure method that are able to realize a required pattern-transfer accuracy independent of the deflection distortion and aberration of a charged beam.

Another object of the present invention is to provide a charged-beam exposure mask and a charged-beam exposure method that are able to realize a required pattern-transfer accuracy without structural change of a deflection system for a charged beam.

The above objects together with others not specifically mentioned will become clear to those skilled in the art from the following description.

According to a first aspect of the present invention, a charged-beam exposure mask is provided, which includes a substrate with a first area and a second area, a first plurality of cell apertures formed in the first area of the substrate, and a second plurality of cell apertures formed in the second area of the substrate.

The first area of the substrate is designed in such a way that a charged-beam irradiated to the first area has a deflection angle less than a reference angle. The second area of the substrate is designed in such a way that the charged-beam irradiated to the second area has a deflection angle equal to or greater than the reference angle.

Each of the first plurality of cell apertures corresponds to fine patterns necessitating a high pattern-transfer accuracy on a work piece. Each of the second plurality of cell apertures corresponds to rough patterns unnecessitating the high pattern-transfer accuracy.

With the charged-beam exposure mask according to the first aspect of the present invention, a first plurality of cell apertures are formed in a first area of a substrate, and a second plurality of cell apertures are formed in a second area of the substrate. Each of the first plurality of cell apertures corresponds to fine patterns necessitating a high pattern-transfer accuracy on a work piece. Each of the second plurality of cell apertures corresponds to rough patterns unnecessitating the high pattern-transfer accuracy.

Further, the first area of the substrate is designed in such a way that a charged-beam irradiated to the first area has a deflection angle less than a reference angle. The second area of the substrate is designed in such a way that the charged-beam irradiated to the second area has a deflection angle equal to or greater than the reference angle.

Therefore, the fine patterns necessitating high pattern-transfer accuracy are transferred under the condition that the deflection angle of the charged-beam is less than the reference angle. This means that the fine patterns are transferred while the deflection distortion and aberration of the charged beam are suppressed.

On the other hand, the rough patterns unnecessitating the high pattern-transfer accuracy are transferred under the condition that the deflection angle of the charged-beam is equal to or greater than the reference angle. This means that the rough patterns are transferred while the deflection distortion and aberration of the charged beam are comparatively large. However, any problems due to the comparatively large deflection distortion and aberration can be prevented from occurring by properly selecting the value of the reference angle.

As a result, the required pattern-transfer accuracy can be realized independent of the deflection distortion and aberration of the charged beam. Also, the required pattern-transfer accuracy can be realized without structural change of a deflection system for the charged beam.

In a preferred embodiment of the mask according to the first aspect, the high pattern-transfer accuracy is defined by at least one of a wanted minimum feature size equal to or less than a specific value on the work piece and a wanted pattern-placement accuracy equal to or less than a specific value on the work piece.

In another preferred embodiment of the mask according to the first aspect, a shaping aperture for generating a variable-shaped charged-beam is additionally formed in the second area of the substrate. In this case, any pattern other than the cell patterns (for example, random patterns, areas connecting the repeated patterns, and so on) may be transferred to the work piece without replacing the mask with another.

In still another preferred embodiment of the mask according to the first aspect, a third area is additionally formed to be surrounded by the first area in the substrate. The third area of the substrate is designed in such a way that the charged beam irradiated to the third area has a deflection angle substantially equal to zero.

According to a second aspect of the present invention, a charged-beam exposure method is provided, which includes the following steps (a), (b), and (c).

In the step (a), a charged-beam exposure mask having a substrate with a first area and a second area is prepared. A first plurality of cell apertures are formed in the first area of the substrate, and a second plurality of cell apertures are formed in the second area of the substrate. Each of the first plurality of cell apertures corresponds to fine patterns necessitating a high pattern-transfer accuracy on a work piece. Each of the second plurality of cell apertures corresponds to rough patterns unnecessitating the high pattern-transfer accuracy.

In the step (b), a charged beam is irradiated to a selected one of the first plurality of cell apertures with a deflection angle less than a reference angle. Thus, the fine patterns corresponding to the selected one of the first plurality of cell apertures are transferred onto the work piece.

In the step (c), a charged beam is irradiated to a selected one of the second plurality of cell apertures with a deflection angle equal to or greater than the reference angle. Thus, the rough patterns corresponding to the selected one of the second plurality of cell apertures are transferred onto the work piece.

With the charged-beam exposure method according to the second aspect of the present invention, to transfer fine patterns corresponding to a first plurality of cell apertures onto a work piece, a charged beam is irradiated to a selected one of the first plurality of cell apertures with a deflection angle less than a reference angle. Also, to transfer rough patterns corresponding to a second plurality of cell apertures onto the work piece, a charged beam is irradiated to a selected one of the second plurality of cell apertures with a deflection angle equal to or greater than the reference angle.

Therefore, the required pattern-transfer accuracy can be realized independent of the deflection distortion and aberration of the charged bean. Also, the required pattern-transfer accuracy can be realized without structural change of a deflection system for the charged beam.

In a preferred embodiment of the method according to the second aspect, the high pattern-transfer accuracy is defined by at least one of a wanted minimum feature size equal to or less than a specific value on the work piece and a wanted pattern-placement accuracy equal to or less than a specific value on the work piece.

In another preferred embodiment of the method according to the second aspect, a shaping aperture for generating a variable-shaped charged-beam is additionally formed in the second area of the substrate. In this case, any pattern other than the cell patterns (for example, random patterns, areas connecting the repeated patterns, and so on) may be transferred to the work piece without replacing the mask with another.

In still another preferred embodiment of the method according to the second aspect, a third area is additionally formed to be surround by the first area in the substrate. The third area of the substrate is designed in such a way that the charged beam irradiated to the third area has a deflection angle substantially equal to zero.

Additionally, in the charged-beam exposure mask according to the first aspect and the charged-beam exposure method according to the second aspect, the reference angle is preferably set as 10°. This is because the deflection distortion and aberration of the charged beam tend not to be negligible if the deflection angle of the charged beam is greater than 10°.

The specific value of the minimum feature size is preferably set as 0.2 µm or less. This is because the deflection distortion and aberration of the charged beam tend not to be negligible if the minimum feature size on the work piece is 0.2 µm or less.

The specific value of the pattern-placement accuracy is preferably set as 0.1 µm or less. This is because the deflection distortion and aberration of the charged beam tend not to be negligible if the pattern-placement accuracy on the work piece is 0.1 µm or less.

BRIEF DESCRIPTION OF THE DRAWINGS

In order that the invention may be readily carried into effect, it will now be described with reference to the accompanying drawings.

DETAILED DESCRIPTION OF THE PREFERRED EMBODIMENTS

Figure 1:
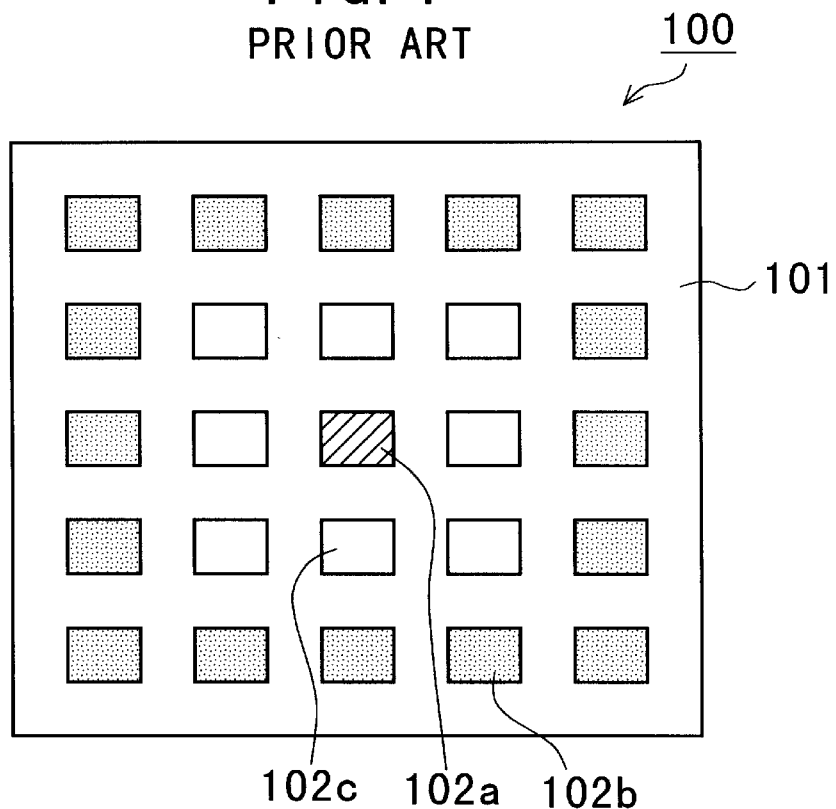
FIG. 1 is a schematic plan view of a conventional electron-beam exposure mask.
Figure 2:
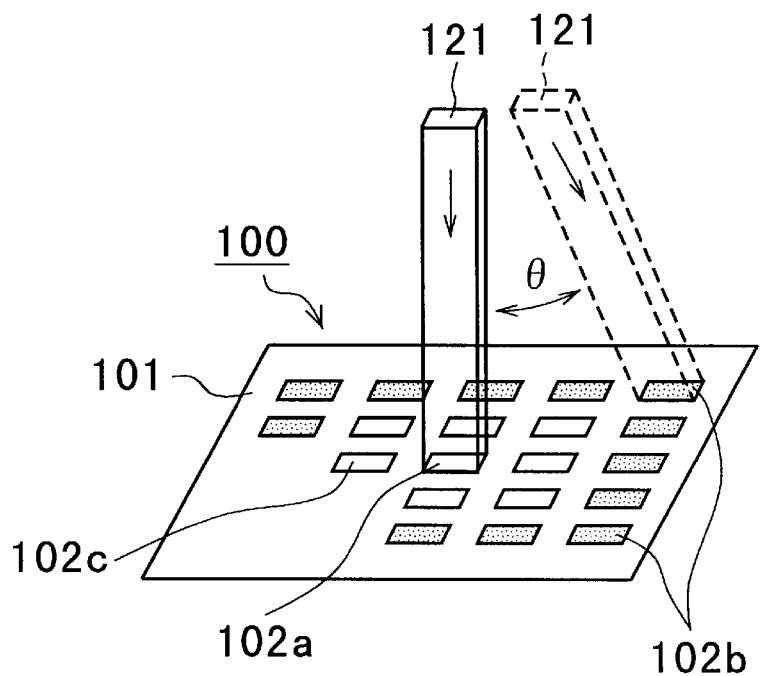
FIG. 2 is a schematic perspective view showing the state where an electron beam is irradiated to one of the cell apertures in the conventional electron-beam exposure mask in FIG. 1.

Preferred embodiments of the present invention will be described below referring to the drawings attached.

FIRST EMBODIMENT

Figure 3:
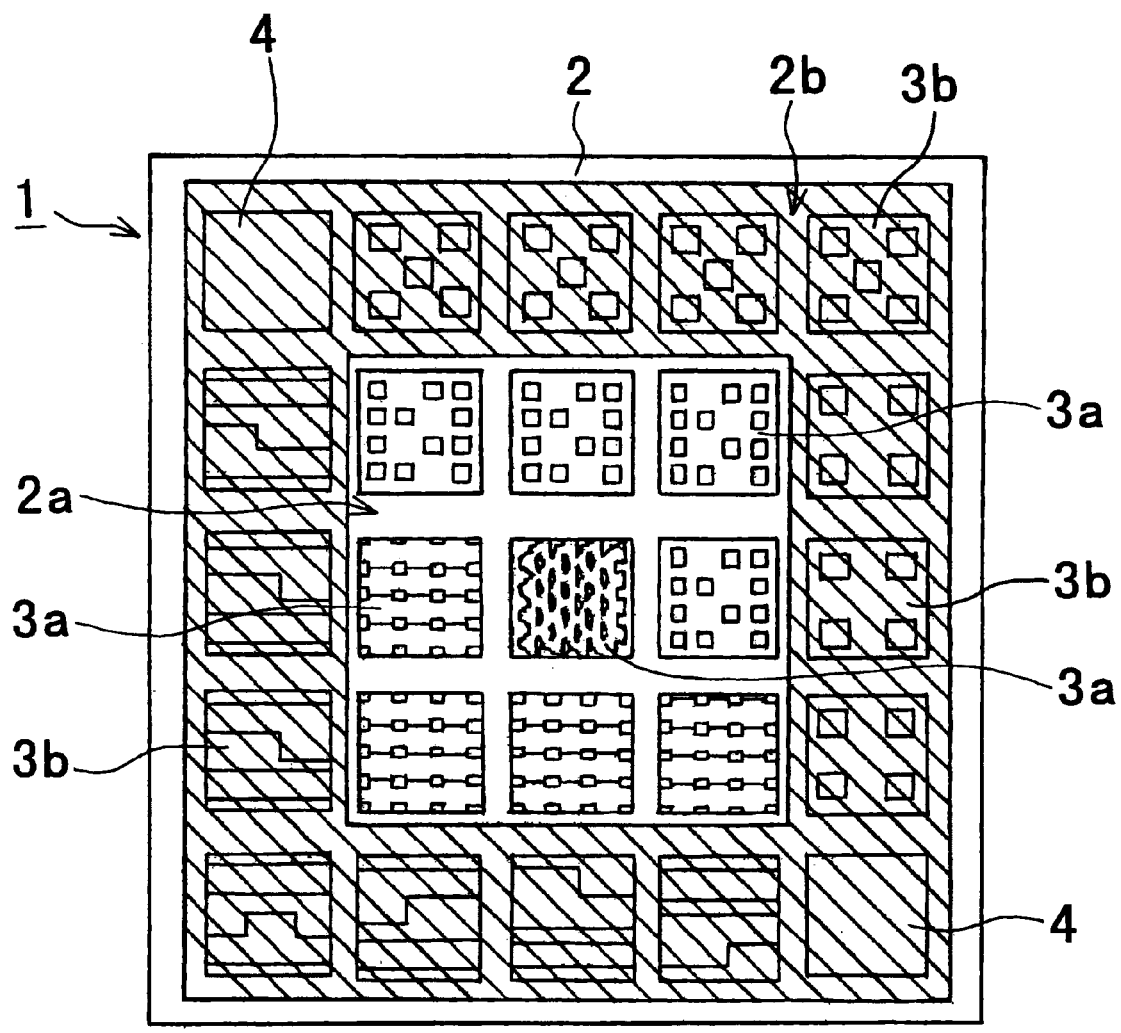
FIG. 3 is a schematic plan view of an electron-beam exposure mask according to a first embodiment of the present invention.

An electron-beam exposure mask according to a first embodiment of the present invention has a configuration as shown in FIG. 3.

As shown in FIG. 3, an electron-beam exposure mask 1 according to a first embodiment has a square substrate 2. The substrate 2 is divided into an inner area 2a and an outer area 2b. The inner area 2a has a square shape. The outer area 2b, which surrounds the inner area 2a, has a square-ringed shape. The centers of the inner and outer areas 2a and 2b are located at the center of the substrate 2.

Nine cell apertures 3a and sixteen cell apertures 3b are regularly formed in the substrate 2, which are arranged in a matrix array. Each of the cell apertures 3a and 3b corresponds to repetitive patterns of geometric shapes to be transferred onto a semiconductor wafer. The inner cell apertures 3a are located in the inner area 2a. The outer cell apertures 3b are located in the outer area 2b.

Here, the inner cell apertures 3a are designed to form or transfer fine memory-cell patterns of geometric shapes of a semiconductor memory device onto the wafer, respectively. The memory-cell patterns necessitate a high pattern-transfer accuracy on the wafer. The outer cell apertures 3b are designed to form or transfer rough peripheral-circuit patterns of geometric shapes of the semiconductor memory device onto the wafer, respectively. The peripheral-circuit patterns do not necessitate a high pattern-transfer accuracy on the wafer.

In this first embodiment, two square shaping apertures 4 are additionally formed in the outer area 2b, as shown in FIG. 3. The shaping apertures 4 are used to form a conventional variable-shaped electron beam.

Figure 4:
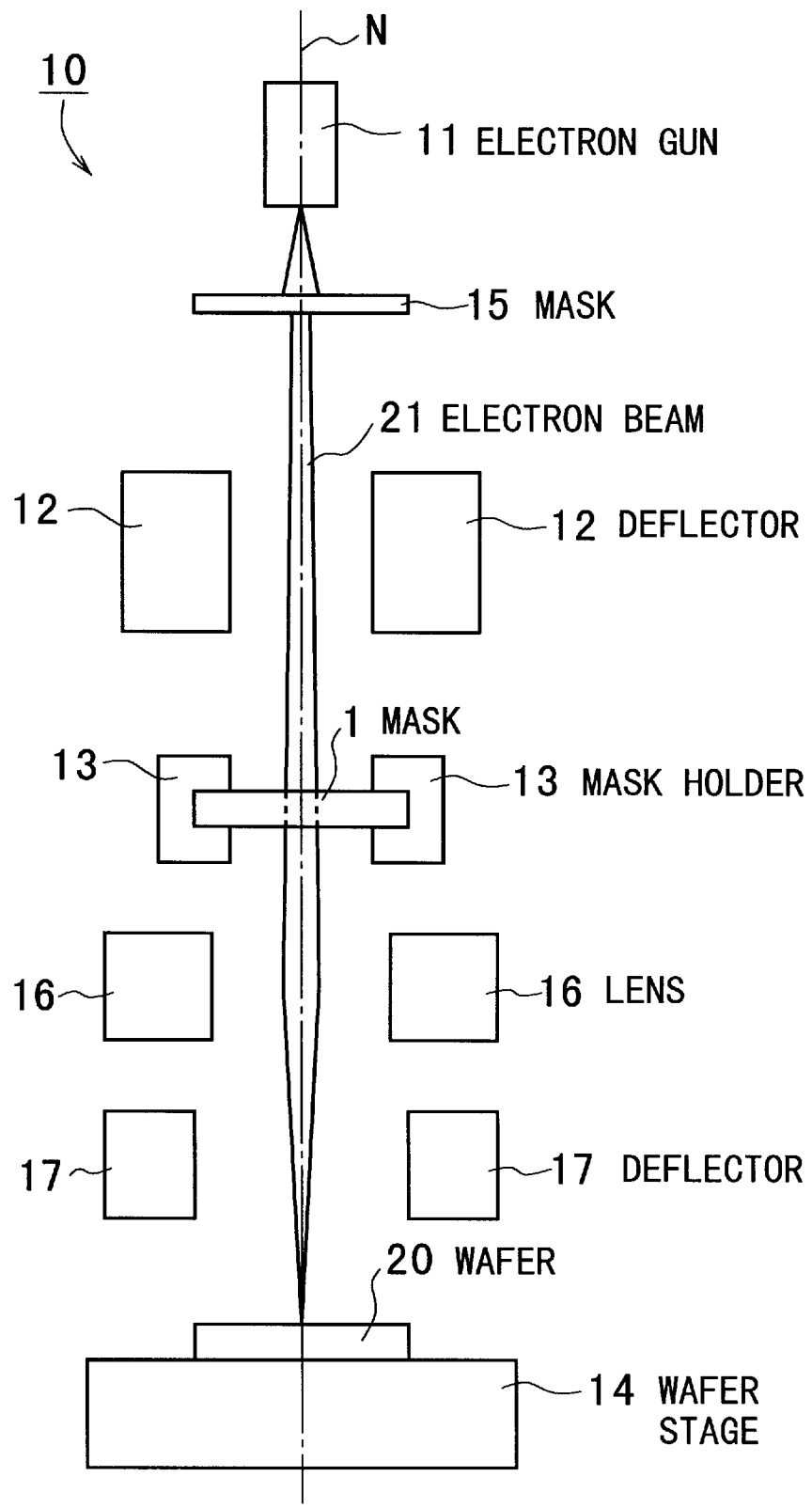
FIG. 4 is a schematic view of an electron-beam exposure system to be used for the electron-beam exposure mask according to the first embodiment in FIG. 3.

FIG. 4 shows an electron-beam exposure system 10 that performs the conventional cell projection method. This system includes an electron gun 11, a first beam deflector 12, a mask holder 13, a projection lens system 16, a second beam deflector 17, and a wafer stage 14.

On operation, a first shaping mask 15 is fixed between the electron gun 11 and the first beam deflector 12. The first shaping mask 15 has a first shaping aperture (not shown) with a square shape. The exposure mask 1 according to the first embodiment is fixed onto the mask holder 13. A semiconductor wafer 20 is located on the wafer stage 14 as a work piece.

An electron beam 21, which has been emitted by the electron gun 11, is first irradiated to the first shaping mask 15, thereby forming the square-shaped electron beam 21.

The beam deflector 12 deflects the square-shaped electron beam 21 along two orthogonal directions in a plane perpendicular to the axis of the electron beam 21. The beam 21 is deflected by the deflector 12 toward a desired one of the cell apertures 2a and 2b and the shaping apertures 4, thereby selecting the desired aperture 2a, 2b, or 4, as necessary.

The projection lens system 16 projects the electron beam 21 having passed through the selected one of the apertures 2a, 2b, and 4 to the wafer 20 on the stage 14.

The second beam deflector 17 deflects the beam 21 to locate the beam 21 at a wanted position on the wafer 20, thereby transferring the corresponding patterns to the selected aperture 2a, 2b, or 4 onto the wafer 20.

As the inner apertures 2a, fine patterns the minimum feature size (or minimum line width) of which is very small (e.g., equal to 0.2 µm or less) are used. For example, patterns of a memory cell are used as the inner apertures 2a, which necessitates a very small minimum feature size.

Also, even if the feature size is not very small, any patterns the pattern-placement accuracy of which is very severe (e.g., equal to 0.1 μm or less) are used as the inner apertures 2a. For example, patterns of lower-level contact holes or gate electrodes pattern of MOSFETs are used as the inner apertures 2a.

As the outer apertures 2b, rough patterns the minimum feature size of which is not very small (e.g., greater than 0.2 μm) are used. Additionally, any patterns the pattern-placement accuracy of which is not very severe (e.g., greater than 0.1 μm) are used as the outer apertures 2b. For example, patterns of upper-level contact holes, peripheral circuits of a memory device, or wiring layers are used as the outer apertures 2b.

Next, the operation of the electron-beam exposure system in FIG. 4 is explained below.

Figure 5A:
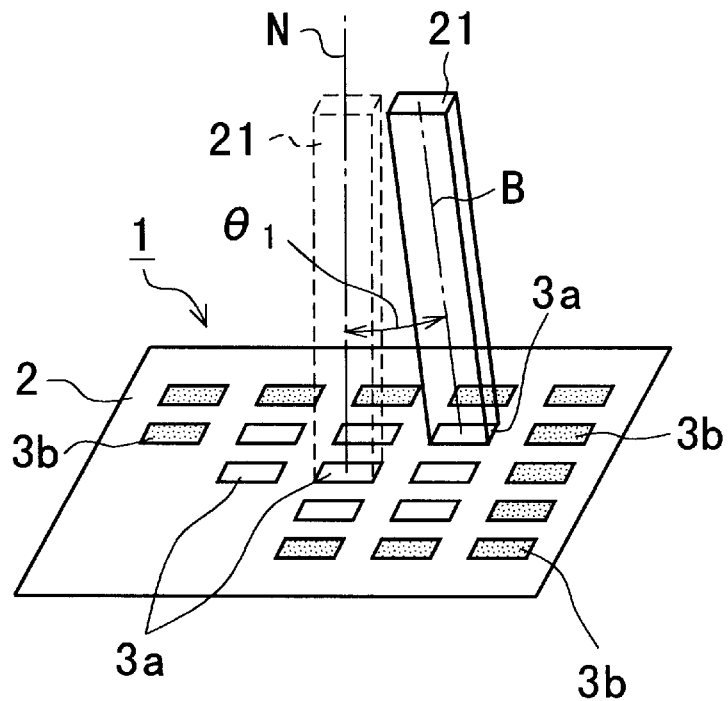
FIG. 5A is a schematic perspective view showing the state where an electron beam is irradiated to one of the first cell apertures located in the inner area of the electron-beam exposure mask according to the first embodiment in FIG. 3.

In a step, the electron beam 21 is irradiated to a selected one of the inner cell apertures 3a with a deflection angle $\theta_1$ with respect to a normal N (i.e., the axis of the non-deflected electron beam 21) of the mask 1, as shown in FIG. 5A. A reference character B in FIG. 5A denotes an axis of the deflected electron beam 21. The deflection angle $\theta_1$ is less than a reference angle. Thus, the fine cell patterns corresponding to the selected one of the cell apertures 3a are transferred onto the wafer 20.

Figure 5B:
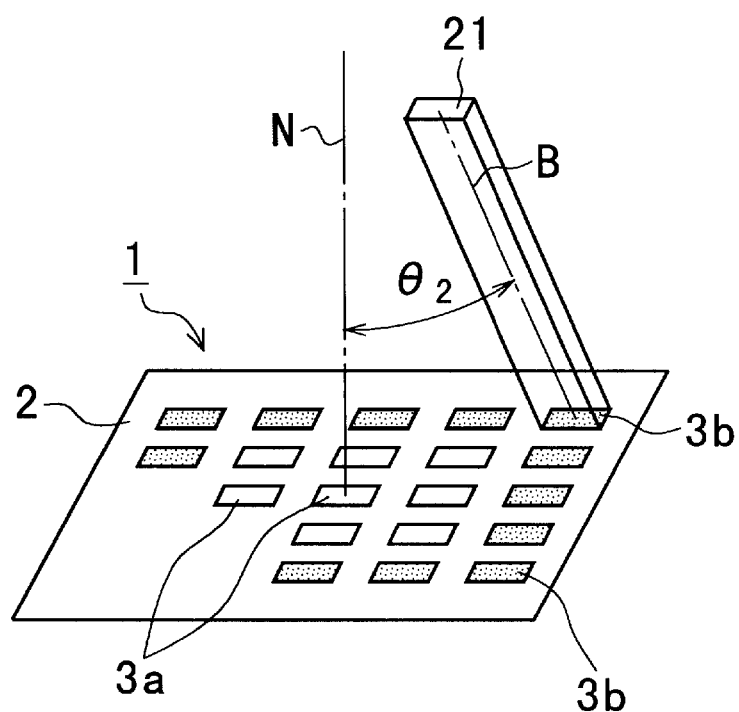
FIG. 5B is a schematic perspective view showing the state where an electron beam is irradiated to one of the second cell apertures located in the outer area of the electron-beam exposure mask according to the first embodiment in FIG. 3.

In another step, the electron beam 21 is irradiated to a selected one of the outer cell apertures 3b with a deflection angle $\theta_2$ with respect to the normal N, as shown in FIG. 5B, where $\theta_1 < \theta_2$. The deflection angle $\theta_2$ is greater than the reference angle. Thus, the rough patterns corresponding to the selected one of the outer cell apertures 3b are transferred onto the wafer 20.

In still another step, the electron beam 21 is irradiated to a selected one of the shaping apertures 4 with the same deflection angle $\theta_2$ with respect to the normal N, as shown in FIG. 5B. Thus, the random patterns corresponding to the selected one of the shaping apertures 4 are transferred onto the wafer 20.

With the electron-beam exposure mask 1 according to the first embodiment, the inner cell apertures 3a are formed in the inner area 2a of the substrate 2 and the outer cell apertures 3b are formed in the outer area 2b of the substrate 2. Each of the inner cell apertures 3a corresponds to the fine patterns necessitating the high pattern-transfer accuracy. Each of the outer cell apertures 3b corresponds to the rough patterns unnecessitating the high pattern-transfer accuracy.

Further, the inner area 2a of the substrate 2 is designed in such a way that the electron-beam 21 irradiated to the inner area 2a has the deflection angle $\theta_1$ less than the reference angle. The outer area 2b of the substrate 2 is designed in such a way that the beam 21 irradiated to the outer area 2b has the deflection angle $\theta_2$ greater than the reference angle.

Therefore, the fine patterns 2a necessitating the high pattern-transfer accuracy are transferred under the condition that the deflection angle of the electron-beam 21 is less than the reference angle. This means that the fine patterns 3a are transferred while the deflection distortion and aberration of the beam 21 are suppressed.

On the other hand, the rough patterns 3b unnecessitating the high pattern transfer accuracy are transferred under the condition that the deflection angle of the beam 21 is greater than the reference angle. This means that the rough patterns 3b are transferred while the deflection distortion and aberration of the beam 21 are comparatively large. However, any problems due to the comparatively large deflection distortion and aberration can be prevented from occurring by properly selecting the value of the reference angle.

As a result, the required pattern-transfer accuracy can be realized independent of the deflection distortion and aberration of the electron beam 21. Also, the required pattern-transfer accuracy can be realized without structural change of the electron optical system for deflecting the beam 21.

Additionally, since the two shaping apertures 4 are formed in the outer area 2b, there is an additional advantage that any pattern other than the cell patterns (for example, random patterns, areas connecting the repeated patterns, and so on) may be transferred to the wafer 20 without replacing the mask 1 with another.

Figure 6:
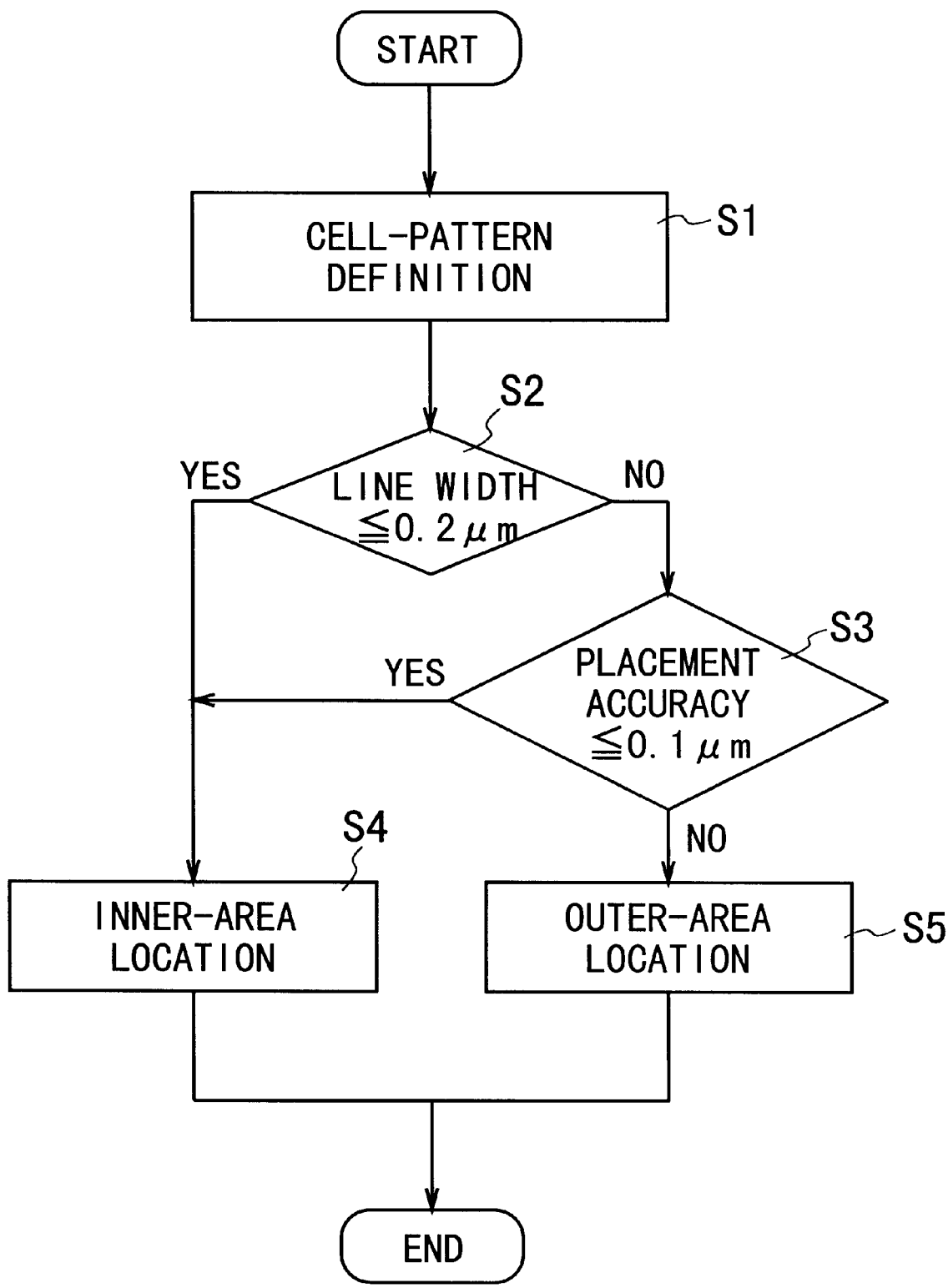
FIG. 6 is a flow chart showing a fabrication process of the electron-beam exposure mask according to the first embodiment in FIG. 3.

FIG. 6 shows a process sequence of producing the exposure mask 1 according to the first embodiment.

In the step S1, a plurality of cell patterns are defined from the layout or exposure data of the semiconductor memory device.

In the step S2, it is judged whether the minimum feature size (or, minimum line width) of the memory cell patterns is equal to or less than 0.2 μm. If the answer is "YES", the step S4 is then performed. If the answer is "NO", the step S3 is then performed.

In the step S3, it is judged whether the placement accuracy of the memory cell patterns is equal to or less than 0.1 μm. If the answer is "YES", the step S4 is then performed. If the answer is "NO", the step S5 is then performed.

In the step S4, cell apertures corresponding to the cell patterns in question are designed to be located in the inner area 2a of the substrate 2 of the mask 1.

In the step S5, cell apertures corresponding to the cell patterns in question are designed to be located in the outer area 2b of the substrate 2 of the mask 1.

The location of the apertures 3a, 3b, and 4 in the steps S4 and S5 is, for example, carried out as follows.

First, a first one of the cell patterns to be located in the inner area 2a is selected and laid out in the cell aperture 3a at the center of the inner area 2a (i.e., the center of the substrate 2). Next, second to ninth ones of the cell patterns to be located in the inner area 2a are selected and successively laid out in the cell apertures 3a around the central aperture 3a. Thereafter, first to sixteenth ones of the cell patterns to be located in the outer area 2b are selected and successively laid out in the cell apertures 3b so as to surround the inner area 2a. Finally, the shaping apertures are laid out at the remaining apertures 4 in the outer area.

Thus, the exposure mask 1 according to the first embodiment in FIG. 3 is obtained.

SECOND EMBODIMENT

In general, the deflection distortion and the aberration of an electron beam vary continuously with the increasing deflection angle. Therefore, the substrate 2 may be divided into three or more areas according to the minimum feature size.

Figure 7:
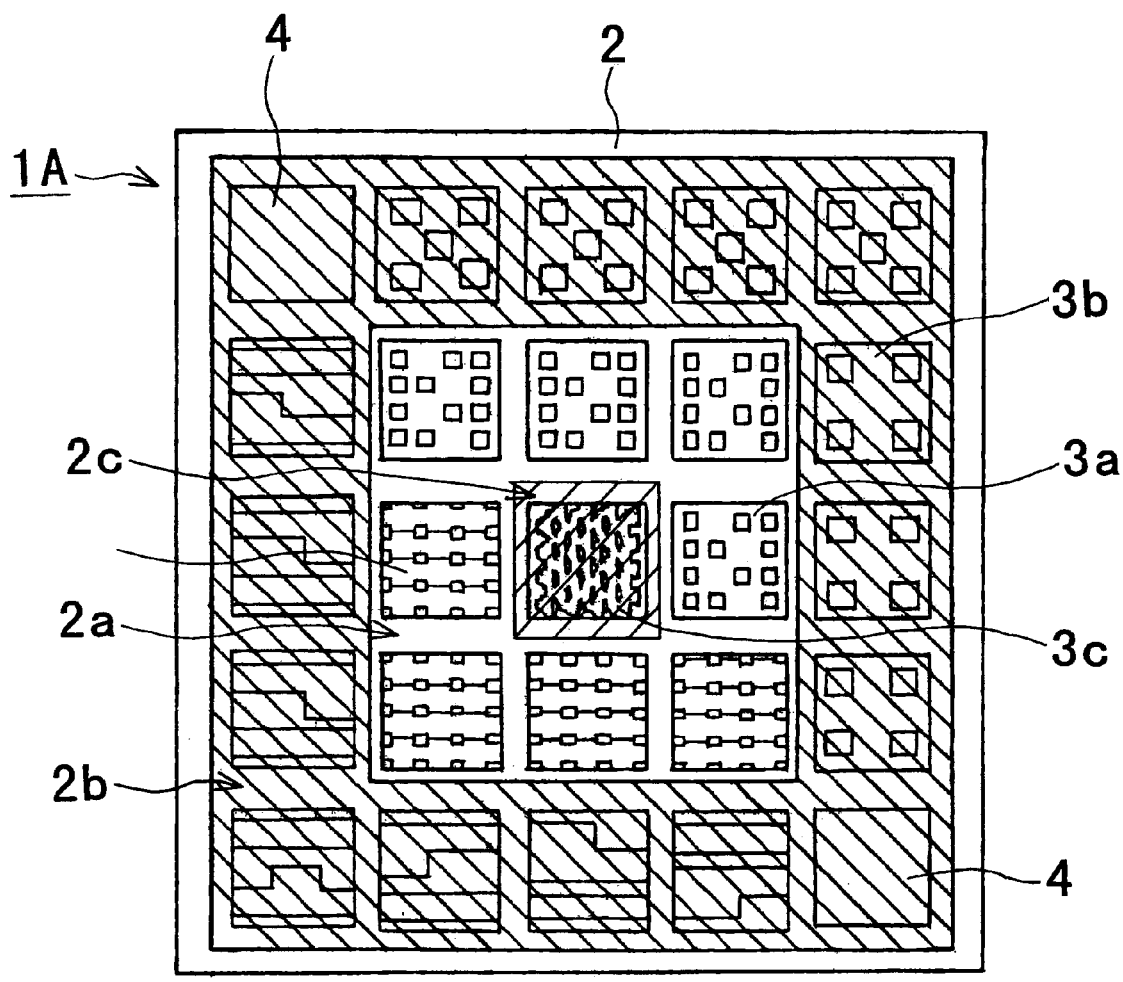
FIG. 7 is a schematic plan view of an electron-beam exposure mask according to a second embodiment of the present invention.

FIG. 7 shows an electron-beam exposure mask 1A according to a second embodiment of the present invention. This mask 1A has substantially the same configuration as the mask 1 according to the first embodiment in FIG. 3, except that a central area 2c is additionally formed in the inner area 2a and that a cell aperture 3c is formed in the central area 2c. The central area 2c is located at the center of the substrate 2.

Therefore, the description about the same configuration is omitted here by adding the same reference numerals to the corresponding elements in FIG. 7 for the sake of simplification of description.

It is clear that there are the same advantages as those in the first embodiment.

In the above first and second embodiments, electron-beam exposure masks are explained. However, it is needless to say that the present invention may be applied to any other charged-beam exposure mask such as an ion-beam exposure mask which is used for ion beam lithography.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A charged-beam exposure mask comprising:
    a substrate with a first area and a second area;
    a first plurality of cell apertures formed in said first area of said substrate;
    a second plurality of cell apertures formed in said second area of said substrate;
    said first area of said substrate being designed in such a way that a charged-beam irradiated to said first area has a deflection angle less than a reference angle;
    said second area of said substrate being designed in such a way that said charged-beam irradiated to said second area has a deflection angle equal to or greater than said reference angle;
    each of said first plurality of cell apertures corresponding to fine patterns necessitating a high pattern-transfer accuracy on a work piece; and
    each of said second plurality of cell apertures corresponding to rough patterns unnecessitating said high pattern-transfer accuracy.

2. A mask as claimed in claim 1, wherein said high pattern-transfer accuracy is defined by at least one of a wanted minimum feature size equal to or less than a specific value on said work piece and a wanted pattern-placement accuracy equal to or less than a specific value on said work piece.

3. A mask as claimed in claim 1, further comprising a shaping aperture for generating a variable-shaped charged-formed in said second area of said substrate.

4. A mask as claimed in claim 1, further comprising a third area formed to be surround by said first area in said substrate;
    wherein said third area of said substrate is designed in such a way that said charged beam irradiated to said third area has a deflection angle substantially equal to zero.

5. A mask as claimed in claim 1, wherein said reference angle is 10°.

6. A mask as claimed in claim 1, wherein said specific value of said minimum feature size is 0.2 $\mu$, or less.

7. A mask as claimed in claim 1, wherein said specific value of said pattern-placement accuracy is 0.1 $\mu$m or less.

8. A charged-beam exposure method comprising the steps of:
    (a) preparing a charged-beam exposure mask having a substrate with a first area and a second area;
    a first plurality of cell apertures being formed in said first area of said substrate, and a second plurality of cell apertures being formed in said second area of said substrate;
    each of said first plurality of cell apertures corresponding to fine patterns necessitating a high pattern-transfer accuracy on a work piece;
    each of said second plurality of cell apertures corresponding to rough patterns unnecessitating said high pattern-transfer accuracy;
    (b) irradiating a charged beam to a selected one of said first plurality of cell apertures with a deflection angle less than a reference angle, thereby transferring said fine patterns corresponding to said selected one of said first plurality of cell apertures onto said work piece;
    (c) irradiating a charged beam to a selected one of said second plurality of cell apertures with a deflection angle equal to or greater than said reference angle, thereby transferring said rough patterns corresponding to said selected one of said second plurality of cell apertures onto said work piece.

9. A method claimed in claim 8, wherein said high pattern-transfer accuracy is defined by at least one of a wanted minimum feature size equal to or less than a specific value on said work piece and a wanted pattern-placement accuracy equal to or less than a specific value on said work piece.

10. A method as claimed in claim 8, further comprising a shaping aperture for generating a variable-shaped charged-formed in said second area of said substrate.

11. A method as claimed in claim 8, further comprising a third area formed to be surround by said first area in said substrate;
    wherein said third area of said substrate is designed in such a way that said charged beam irradiated to said third area has a deflection angle substantially equal to zero.

12. A method as claimed in claim 8, wherein said reference angle is 10°.

13. A method as claimed in claim 8, wherein said specific value of said minimum feature size is 0.2 $\mu$m or less.

14. A method as claimed in claim 8, wherein said specific value of said pattern-placement accuracy is 0.1 $\mu$m or less.

* * * * *